(12) United States Patent
Chan et al.

(10) Patent No.: US 7,746,131 B2
(45) Date of Patent: Jun. 29, 2010

(54) RESET SIGNAL FILTER

(75) Inventors: Cheng-Hsun Chan, Taipei County (TW); Che-Li Lin, Taipei (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 12/344,198

(22) Filed: Dec. 24, 2008

(65) Prior Publication Data
US 2010/0026357 A1 Feb. 4, 2010

(30) Foreign Application Priority Data
Aug. 1, 2008 (TW) .............................. 97129311 A

(51) Int. Cl.
*H03L 7/00* (2006.01)

(52) U.S. Cl. ..................... 327/143; 327/198; 327/551

(58) Field of Classification Search .............. 327/142, 327/143, 198, 551, 552, 558
See application file for complete search history.

(56) References Cited

U.S. PATENT DOCUMENTS

| | | | | |
|---|---|---|---|---|
| 6,175,603 B1 * | 1/2001 | Chapman et al. | ............ | 375/354 |
| 6,252,466 B1 * | 6/2001 | Kawamura | .................. | 331/25 |
| 6,823,029 B1 * | 11/2004 | Chapman et al. | ............ | 375/354 |

* cited by examiner

*Primary Examiner*—Lincoln Donovan
*Assistant Examiner*—William Hernandez
(74) *Attorney, Agent, or Firm*—Winston Hsu

(57) ABSTRACT

A reset signal filter includes a power voltage detector and a reset signal detector or includes only one reset signal detector. The power voltage detector includes a comparators and a basic logic gates (e.g. AND gate, OR gate, inverter, etc). The reset signal detector includes a comparator, N flip flops connected in series, an AND gate, an OR gate, a multiplexer and an output flip flop. The reset signal filter receives a first reset signal generated by a power voltage detector or a Schmitt trigger buffer and utilizes N flip flops to register the signal level of the first reset signal for N clock periods. Then the reset signal filter determines if the first rest signal is changed during N clock periods, and outputs a second reset signal.

16 Claims, 14 Drawing Sheets

RESET SIGNAL FILTER

BACKGROUND OF THE INVENTION

1. Field of the Invention

The present invention relates to a reset signal filter, and more particularly, to a reset signal filter for stabilizing a reset signal generated by a Schmitt trigger buffer or the external reset circuit.

2. Description of the Prior Art

Generally speaking, the reset signal is usually generated according to a delay signal generated by a circuit including resistors and capacitors inside or outside an IC chip, and a Schmitt trigger buffer of the IC chip can generate the reset signal according to the delay signal. However, instability of the external power or noise of the circuit may cause the IC chip switching to the reset state unexpectedly.

Please refer to FIG. 1. FIG. 1 is a schematic diagram of a reset circuit according to the prior art. The external reset circuit of an IC chip includes resistors and capacitors connected in series. The external reset circuit can be divided into two types. Part (A) is a low active reset circuit including a resistor RA coupled to a power end VDDIO and a pin of an IC chip, and a capacitor CA coupled to a ground end GND and the pin of the IC chip. Part (B) is a high active reset circuit including a resistor RB coupled to a ground end GND and a pin of an IC chip, and a capacitor CB coupled to a power end VDDIO and the pin of the IC chip. The reset circuit according to the prior art uses a Schmitt trigger buffer 12 in the IC to generate a reset signal. The Schmitt trigger buffer 12 has two threshold voltages V+ and V−. The values of the threshold voltages V+ and V− are varied according to the design of the Schmitt trigger buffer 12. The input voltages VA and VB of the IC chip are generated by the external reset circuit of the IC chip. The Schmitt trigger buffer 12 outputs a low active or high active reset signal as logic "1" when the input voltages VA or VB of the IC chip is greater than the threshold voltage V+. On the contrary, the Schmitt trigger buffer 12 outputs a low active or high active reset signal as logic "0" when the input voltages VA or VB of the IC chip are smaller than the threshold voltage V−.

Please refer to FIG. 2. FIG. 2 is a waveform diagram of the reset circuit in FIG. 1. Part (A) is signal waveform of the low active reset circuit. Part (B) is signal waveform of the high active reset circuit. From the waveform of the input signals VA and VB, the Schmitt trigger buffer 12 filters out the small noise caused by the external power or the external circuit of the IC chip. The noise is in the range of VDDIO and V−. However, when the noise is great or the external power is unstable, the Schmitt trigger buffer 12 cannot filter the noise out. Thus, when the noise oscillates in the range of the voltage lower than V− or higher than V+, the IC chip will be switched to the reset state randomly.

SUMMARY OF THE INVENTION

The present invention provides a reset signal filter. The reset signal filter comprises a first comparator, N flip-flops connected in series, a first logic gate, and an output flip-flop. The first comparator compares a power voltage and a first reference voltage so as to generate a first comparison signal. The N flip-flops are connected in series. A reset port of each flip-flop receives the first comparison signal. An input port of each flip-flop is coupled to an output port of a preceding flip-flop. An input port of the first one of the N flip-flops receives a first reset signal generated by a Schmitt trigger buffer or the external reset circuit. The N flip-flops connected in series register the logical levels of the first reset signal during N clock periods. A first logic gate has N input ports coupled to output ports of the N flip-flops connected in series respectively, for determining if the logical levels of the first reset signal are identical during N clock periods and generating a logic signal. The output flip-flop, being coupled to the first logic gate, receives the logic signal and outputs a second reset signal.

The present invention further provides a reset signal filter. The reset signal filter comprises a rest signal detector. The reset signal detector receives a first reset signal to generate a second reset signal. The reset signal detector comprises a non-reset state detection circuit and a reset state detection circuit. The non-reset state detection circuit detects the first reset signal whether the first reset signal remains in the non-reset state or the reset state over N clock periods.

The present invention further provides a method of generating a stable reset signal. The method comprises receiving a first reset signal; and generating a second reset signal when the first reset signal remaining in the non-reset state or the reset state over N clock periods.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
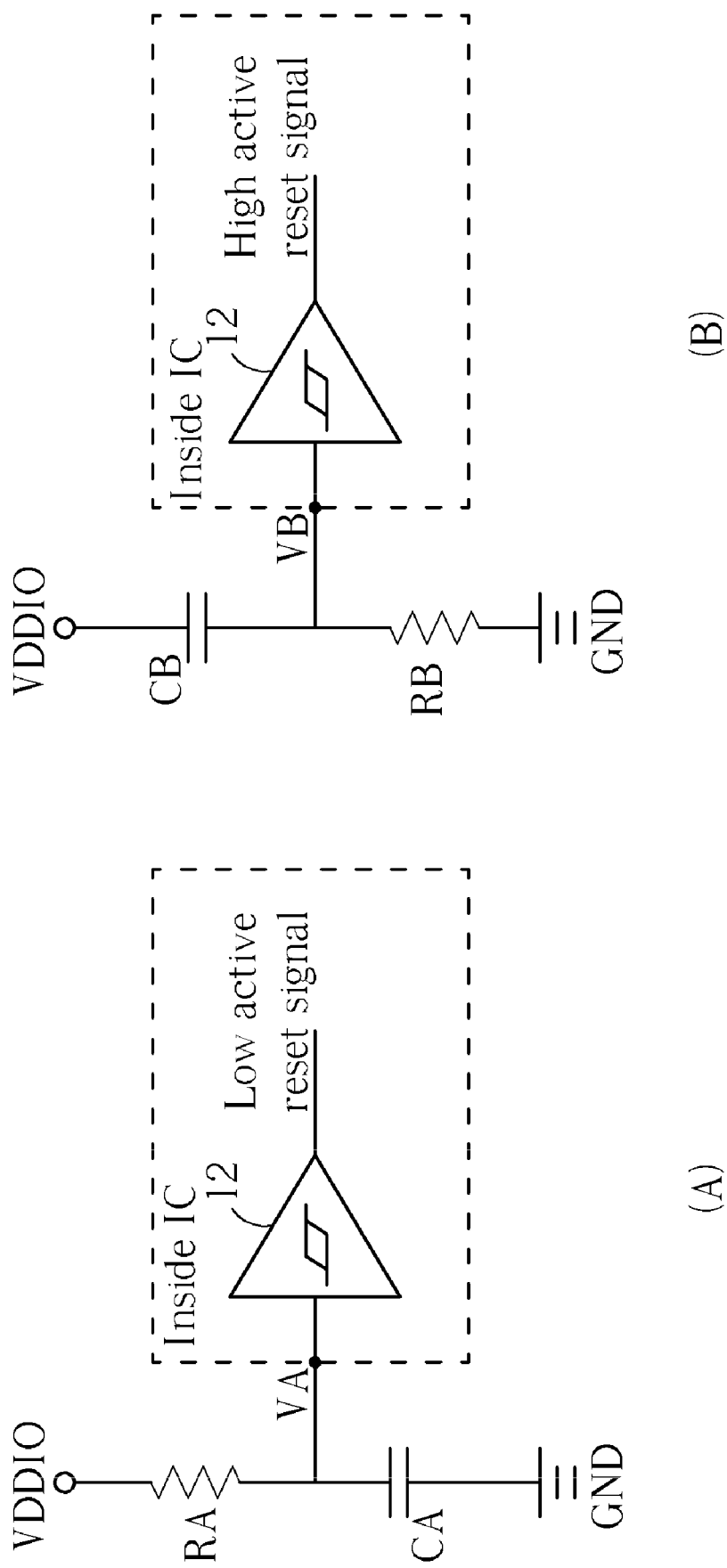
FIG. 1 is the diagram of the reset circuit in conventional technology.
Figure 2:
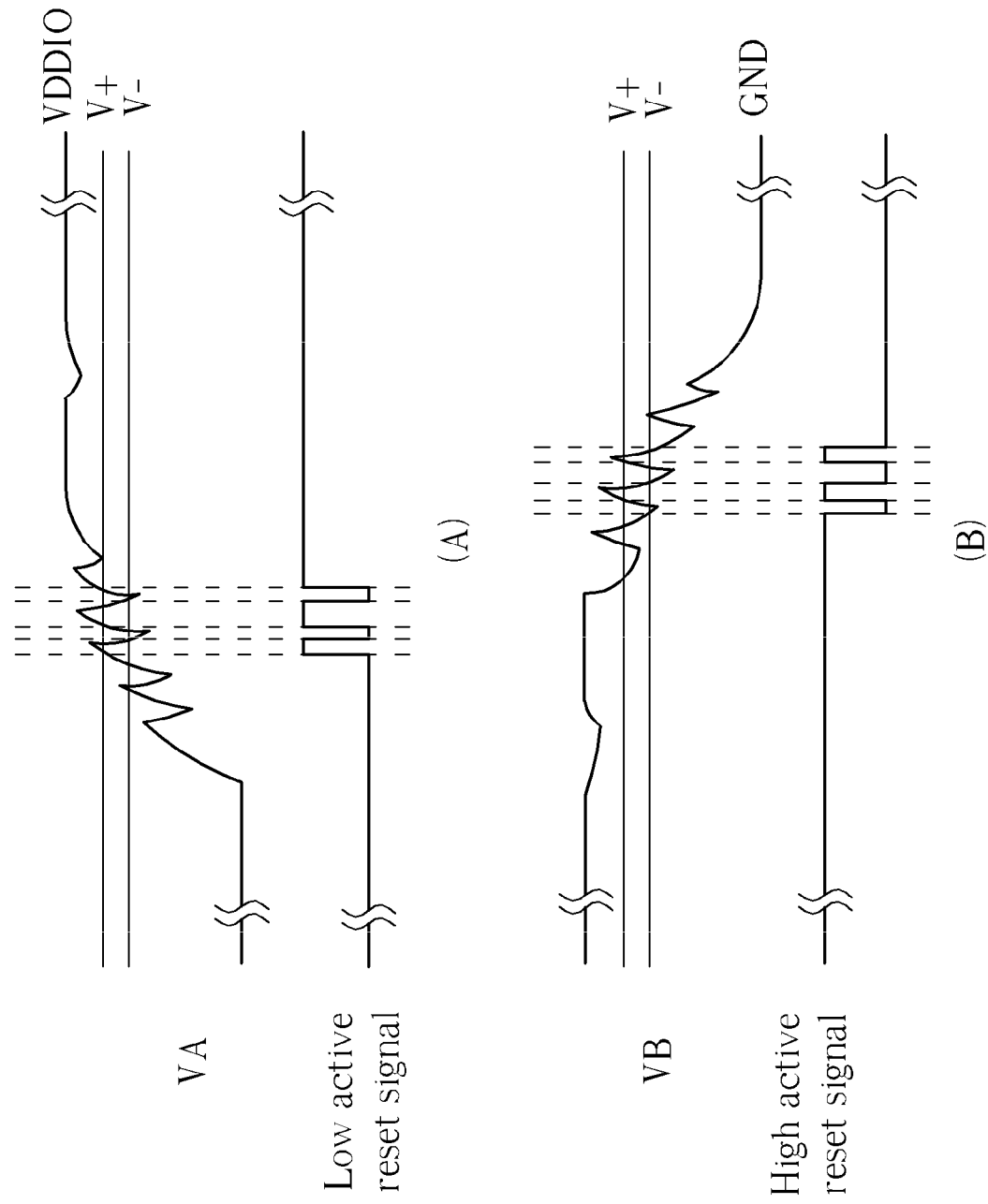
FIG. 2 is the signal waveform diagram of the reset circuit in FIG. 1
Figure 3:
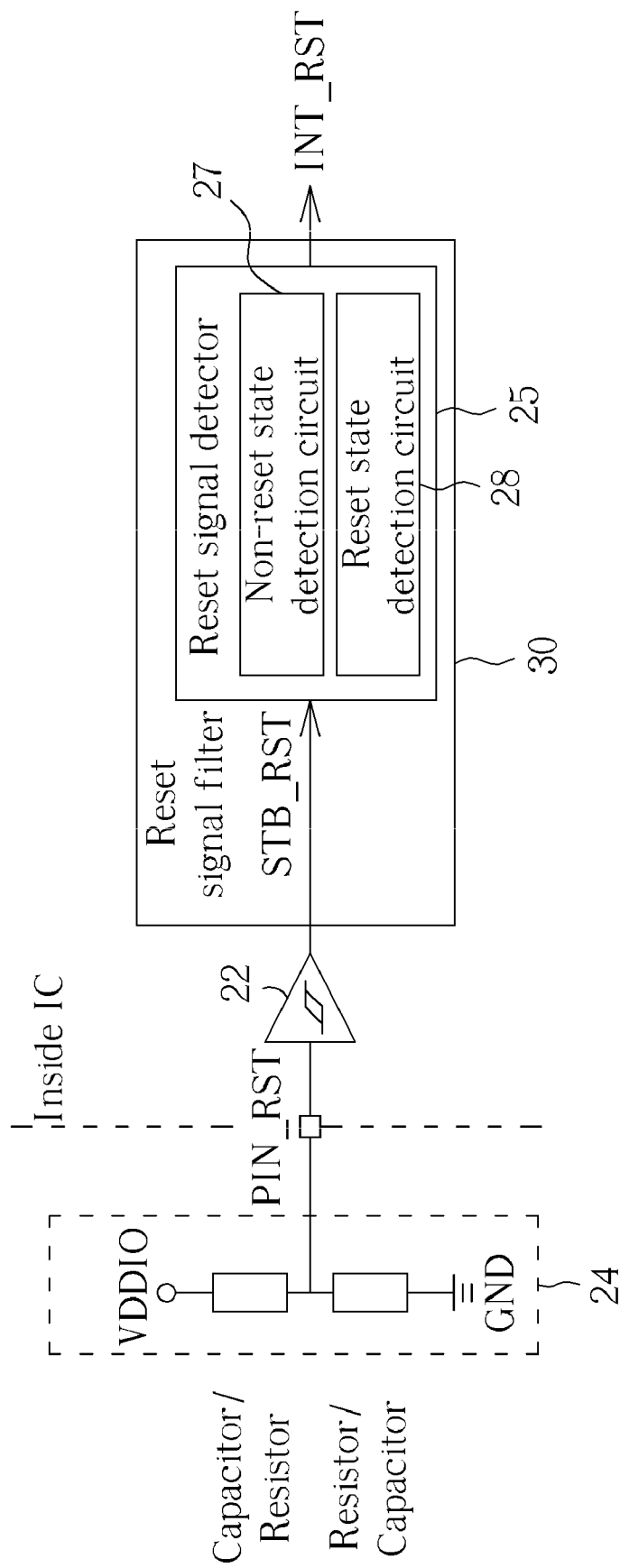
FIG. 3 is the block diagram of the first embodiment illustrating the reset signal filter of the invention.

Please refer to FIG. 3. FIG. 3 is a block diagram of a first embodiment of a reset signal filter according to the present invention. The reset signal filter 30 comprises a reset signal detector 25. The reset signal filter 30 are coupled to an output end of a Schmitt trigger buffer 22. The Schmitt trigger buffer 22 and the reset signal filter 30 are used to filter out the noise of an input signal PIN_RST of an IC chip so as to generate a stable reset signal INT_RST. The Schmitt trigger buffer 22 and reset signal filter 30 are installed inside the IC chip, and are coupled to a reset circuit 24 outside the IC chip through an external pin (input signal PIN_RST) of the IC chip. The reset circuit 24 includes a resistor and a capacitor connected in series. The reset signal detector 25 comprises a non-reset state detection circuit 27 and a reset state detection circuit 28. When the non-reset state detection circuit 27 is turned on, the reset state detection circuit 28 is turned off. When the reset state detection circuit 28 is turned on, the non-reset state detection circuit 27 is turned off. Thus, the reset signal detector 25 can comprises the non-reset state detection circuit 27 or reset state detection circuit 28 along.

Figure 4:
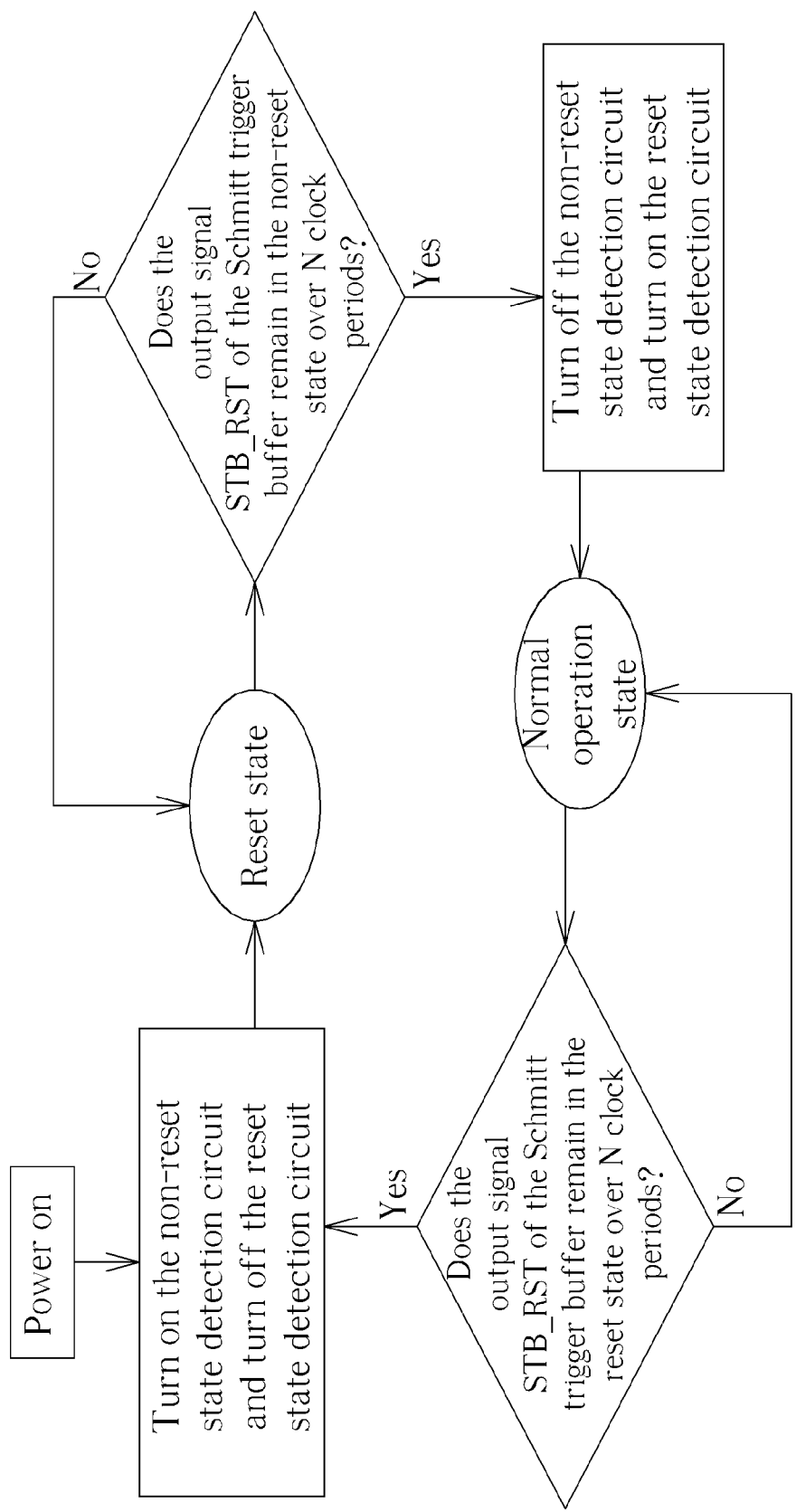
FIG. 4 is the procedure diagram of the first embodiment illustrating the reset signal filter of the invention.

Please refer to FIG. 4. FIG. 4 is a procedure diagram of a first embodiment of a reset signal filter according to the present invention. When the system power is turned on, the reset signal filter 30 turns on the non-reset state detection circuit 27 and turns off the reset state detection 28 to switch the IC chip to the reset state. The non-reset state detection circuit 27 detects if the output signal STB_RST of the Schmitt trigger buffer 22 remains in the non-reset state over N clock periods. N clock periods can be set to fixed periods, variable periods, or programmable periods. In addition, N clock periods can be set according to a clock or a predetermined signal with a period generated from a multiple frequency or a divided frequency. If the output signal STB_RST remains in non-reset state over N clock periods, the non-reset state detection circuit 27 will be turned off and the reset state detection circuit 28 will be turned on to switch the IC chip to the normal operation state. Furthermore, when the IC chip is in the normal operation state, the reset state detection circuit 28 detects if the output signal STB_RST of the Schmitt trigger buffer 22 remains in the reset state over N clock periods. If the output signal STB_RST remains in the reset state over N clock periods, the non-reset state detection circuit 27 will be turned on and the reset state detection circuit 28 will be turned off to switch the IC chip to the reset state.

Figure 5:
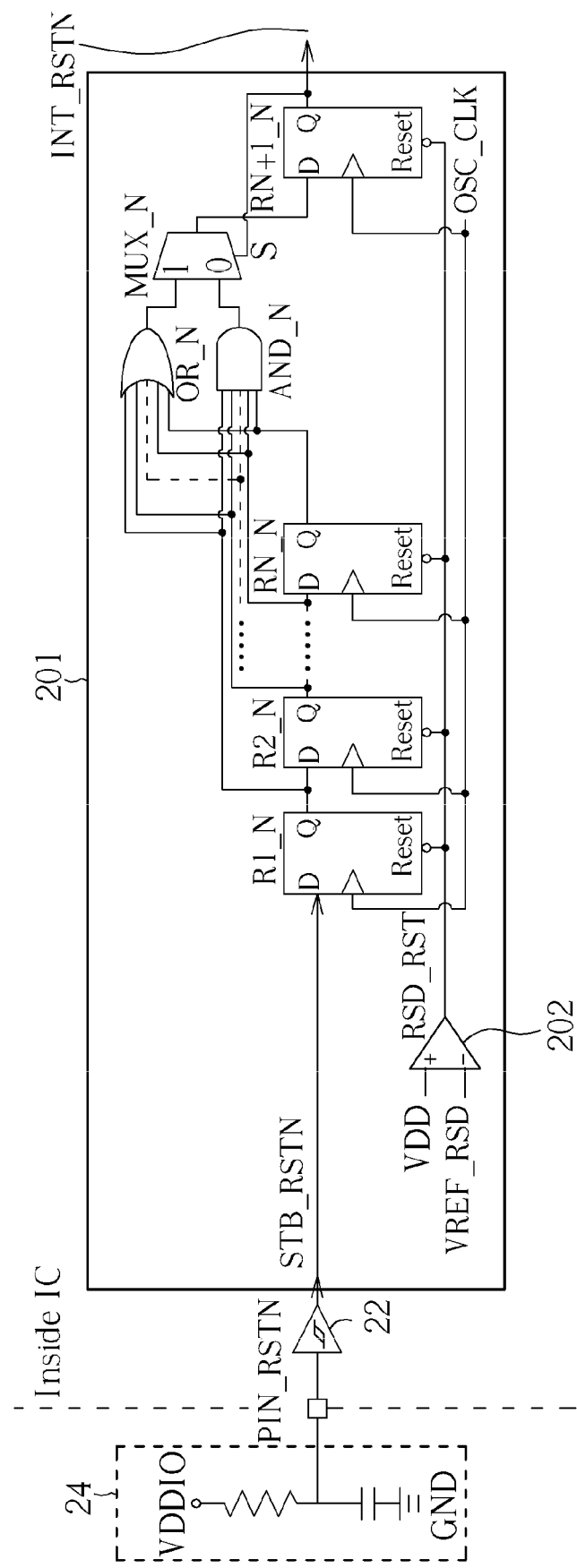
FIG. 5 is the circuit diagram of the first embodiment illustrating the low active reset signal filter.
Figure 6:
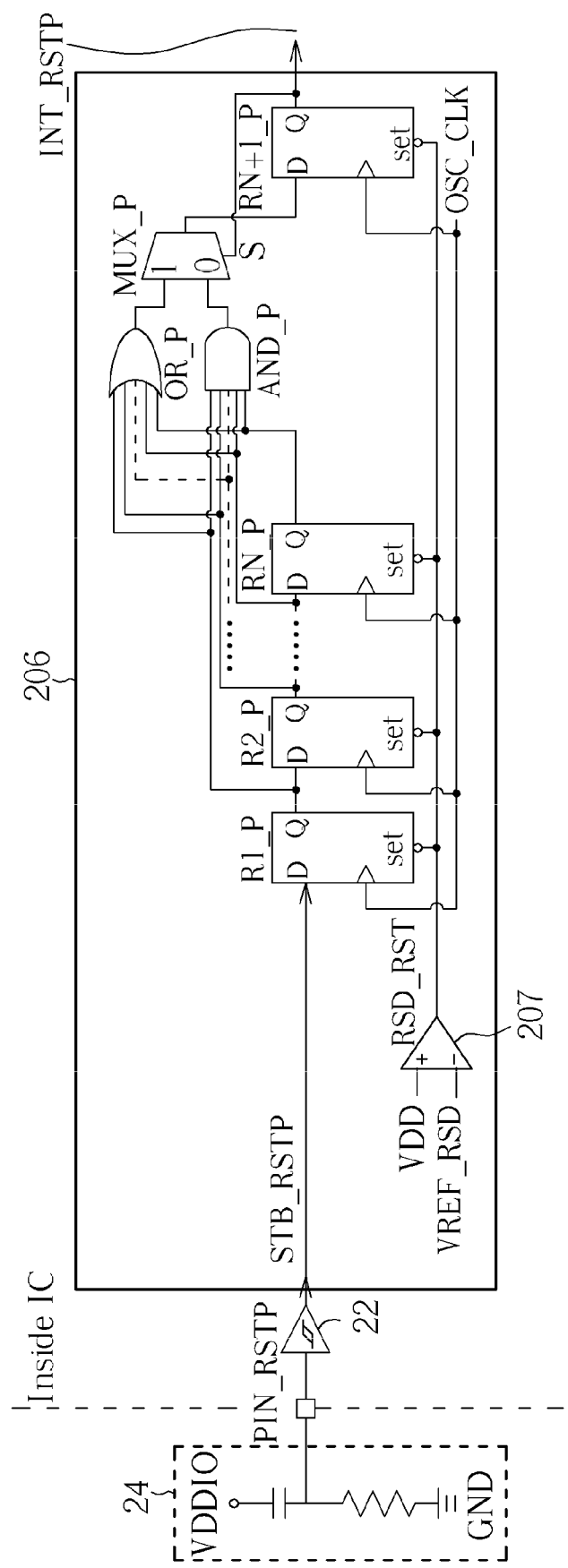
FIG. 6 is the circuit diagram of the first embodiment illustrating the high active reset signal filter.

Please refer to FIG. 5 and FIG. 6. FIG. 5 is a circuitry of the low active reset filter 201 in the first embodiment. FIG. 6 is a circuitry of the high active reset filter 206 in the first embodiment. VDD represents an operation voltage of a core circuit of the IC chip. VREF_RSD represents a reference voltage from an external input or an internal circuit of the IC chip. As shown in FIG. 5, the low active reset filter 201 comprises a reset signal detector. A non-reset state detection circuit of the reset signal detector comprises a comparator 202, N+1 flip-flops R1_N, R2_N, RN_N, RN+1_N, an AND gate AND_N, and a multiplexer MUX_N. N clock periods represents the detection duration of the reset signal detector, which is designed as the requirements. A reset state detection circuit of the reset signal detector comprises a comparator 202, N+1 flip-flops R1_N, R2_N, RN_N, RN+1_N, an OR gate OR_N, and a multiplexer MUX_N. The N+1 flip-flops of the low active reset filter 201 output the logic "0" from output ports (Q) when the input reset signal (RSD_RST) is the logic "0". As shown in FIG. 6, the high active reset filter 206 comprises a reset signal detector. A non-reset state detection circuit of the reset signal detector comprises a comparator 207, N+1 flip-flops R1_P, R2_P, RN_P, RN+1_P, an OR gate OR_P, and a multiplexer MUX_P. In addition, a reset state detection circuit of the reset signal detector comprises a comparator 207, N+1 flip-flops R1_P, R2_P, RN_P, RN+1_P, an AND gate AND_P, and a multiplexer MUX_P. The N+1 flip-flops of the high active reset filter 206 output the logic "1" from output ports (Q) when the input reset signal (RSD_RST) is the logic "0".

Figure 7:
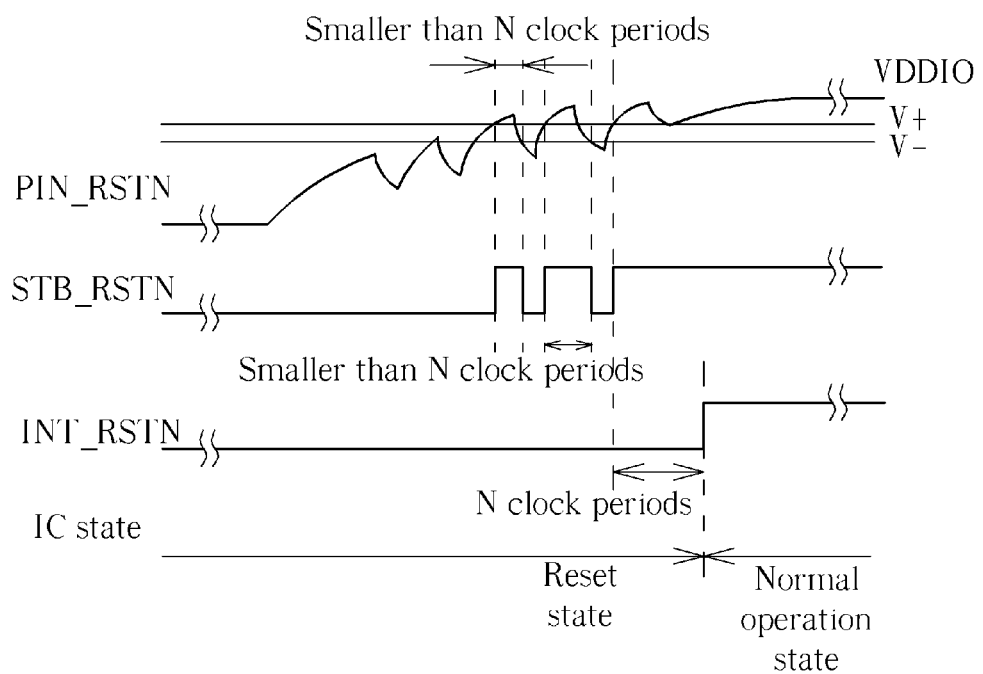
FIG. 7 is the signal waveform diagram of the first embodiment illustrating the low active reset signal filter changed from the reset state to the normal operation state.
Figure 8:
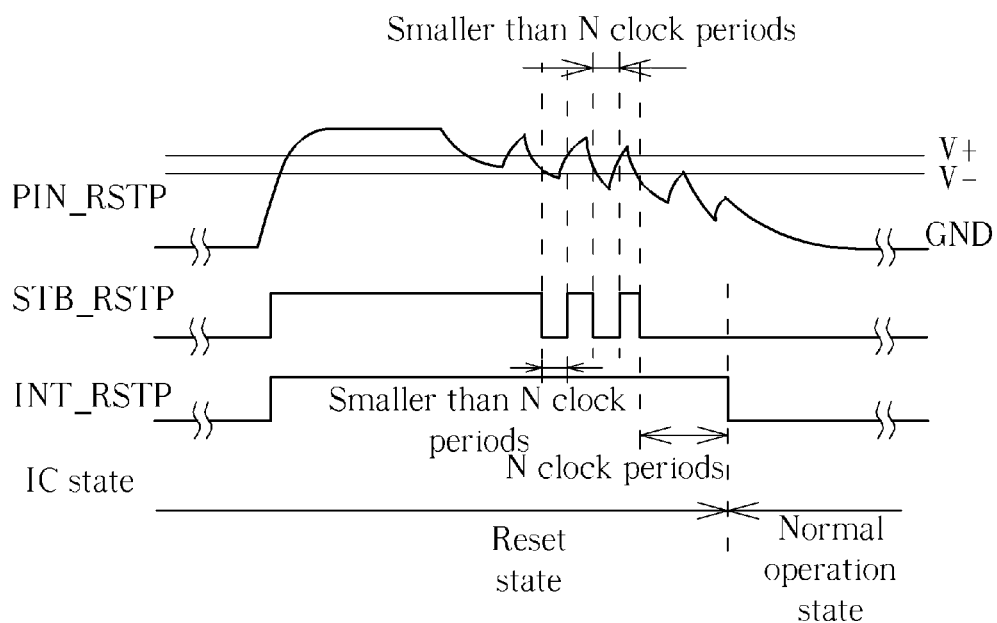
FIG. 8 is the signal waveform diagram of the first embodiment illustrating the high active reset signal filter changed from the reset state to the normal operation state.

Please refer to FIG. 7 and FIG. 8. FIG. 7 is a waveform diagram of the low active reset signal filter 201 in the first embodiment from the reset state to the normal operation state. FIG. 8 is a waveform diagram of the high active reset signal filter 206 in the first embodiment from the reset state to the normal operation state. When the IC chip is in the reset state, the reset state detection circuit is turned off, and the non-reset state detection circuit is turned on. The non-reset state detection circuit utilizes N flip-flops to register the input signal STB_RSTN/STB_RSTP during N clock periods and to determine whether the input signal STB_RSTN/STB_RSTP switches to the non-reset state or not. Thus, the input signal STB_RSTN/STB_RSTP must remain in the non-reset state over N clock periods so that the IC chip can switch from the reset state to the normal operation state. If the input signal STB_RSTN/STB_RSTP cannot remain in the non-reset state over N clock periods, the output reset signal INT_RSTN/INT_RSTP of the reset signal filter will keep the IC chip in the reset state.

Figure 9:
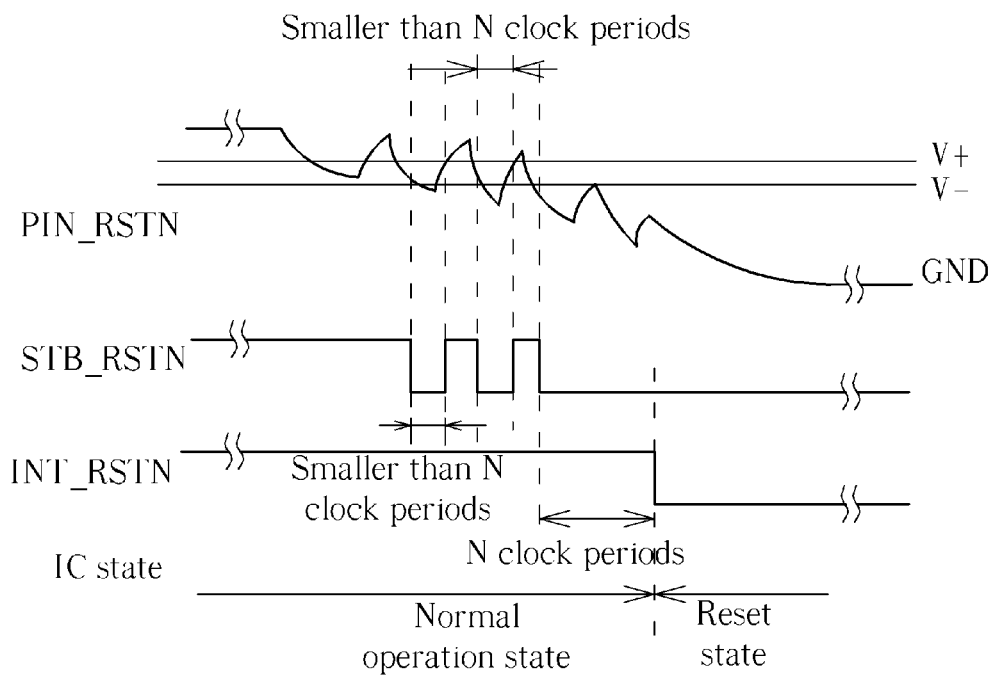
FIG. 9 is the signal waveform diagram of the first embodiment illustrating the low active reset signal filter changed from the normal operation state to the reset state.
Figure 10:
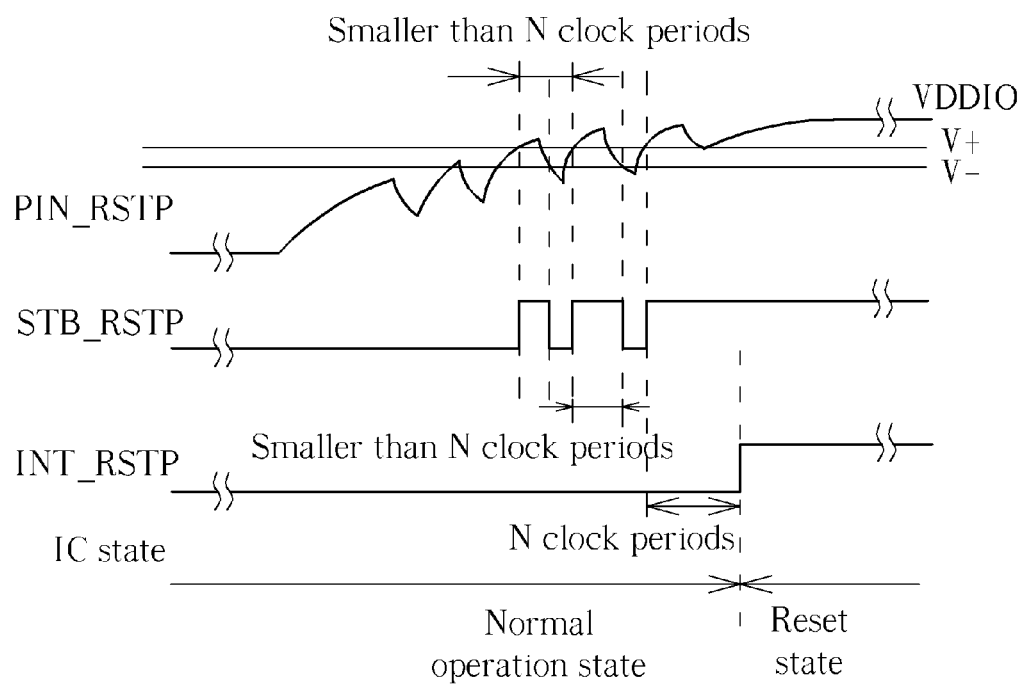
FIG. 10 is the signal waveform diagram of the first embodiment illustrating the high active reset signal filter changed from normal operation state to reset state.

Please refer to FIG. 9 and FIG. 10. FIG. 9 is a waveform diagram of the low active reset signal filter 201 in the first embodiment from the normal operation state to the reset state. FIG. 10 is a waveform diagram of the high active reset signal filter 206 in the first embodiment from the normal operation state to the reset state. When the IC chip is in the normal operation state, the non-reset state detection circuit is turned off, and the reset state detection circuit is turned on. The reset state detection circuit utilizes N flip-flops to register the input signal STB_RSTN/STB_RSTP during N clock periods and to determine whether the input signal STB_RSTN/STB_RSTP switches to the reset state or not. Thus, the input signal STB_RSTN/STB_RSTP must remain in the reset state over N clock periods so that the IC chip can switch from the normal operation state to the reset state. If the input signal STB_RSTN/STB_RSTP cannot remain in the reset state over N clock periods, the output reset signal INT_RSTN/INT_RSTP of the reset signal filter will keep the IC chip in the normal operation state.

Figure 11:
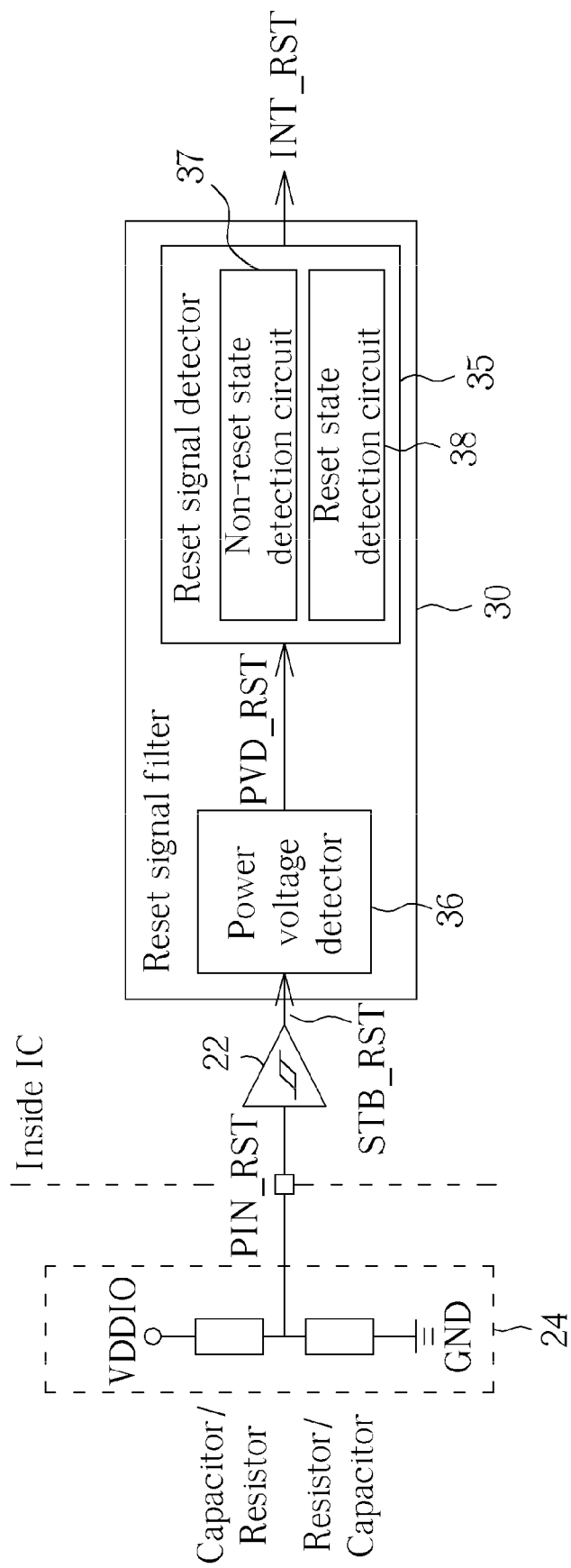
FIG. 11 is the block diagram of the second embodiment illustrating the reset signal filter of the invention.

Please refer to FIG. 11. FIG. 11 is a block diagram of a second embodiment of a reset signal filter according to the present invention. The reset signal filter 30 comprises a power voltage detector 36 and a reset signal detector 35. The function of the reset signal detector 35 is the same to the first embodiment. The power voltage detector 36 detects if an external power voltage is smaller than the lowest operation voltage. The lowest operation voltage is designed as the dedicated requirements. When the external power voltage is not smaller than the lowest operation voltage, this represents the external power voltage is stable, and the power voltage detector 36 will generate a power reset signal PVD_RST according to the output signal STB_RST of the Schmitt rigger buffer 22. Then, the reset signal detector 35 generates a stable reset signal INT_RST according to the power reset signal PVD_RST.

Figure 12:
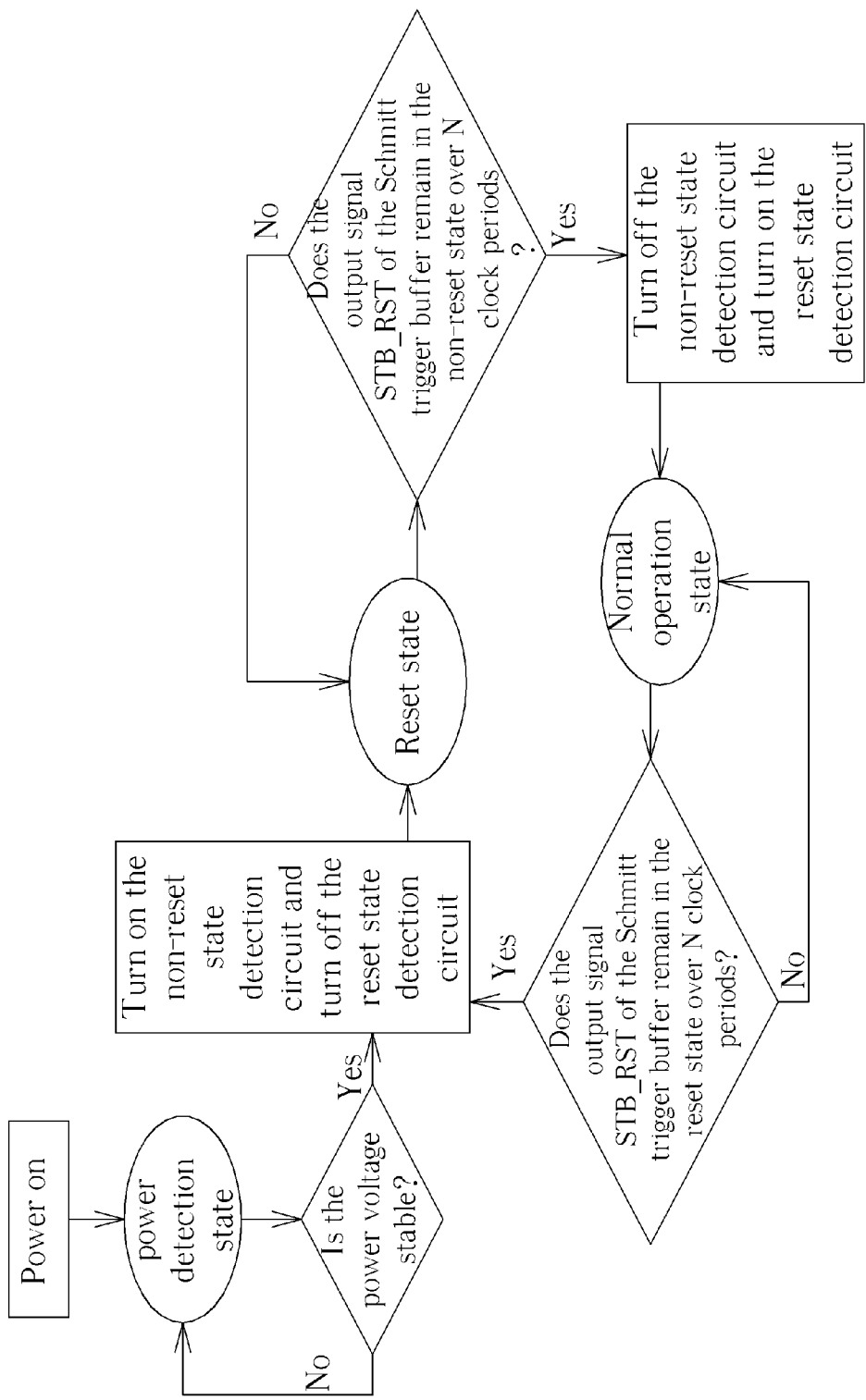
FIG. 12 is the procedure diagram of the second embodiment illustrating the reset signal filter of the invention.

Please refer to FIG. 12. FIG. 12 is a procedure diagram of a second embodiment of a reset signal filter according to the present invention. When the system power is turned on, the IC chip switches to the power detection state immediately. The power voltage detector 36 can determine if the power voltage is stable. When the power voltage is stable, the non-reset state detection circuit 37 is turned on and the reset state detection circuit 38 is turned off, so that the IC chip can switch from power detection state to the reset state. The following operation of the reset signal filter 30 is the same to the first embodiment.

Figure 13:
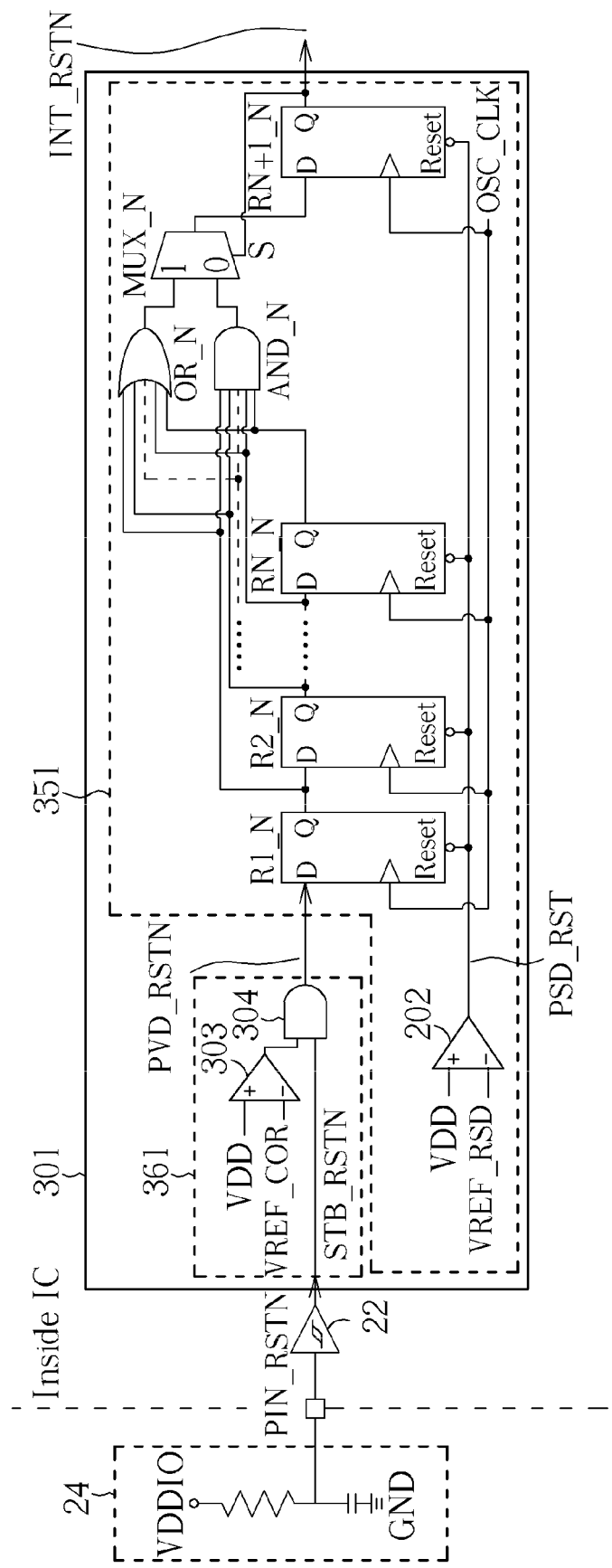
FIG. 13 is the circuit diagram of the second embodiment illustrating the low active reset signal filter.
Figure 14:
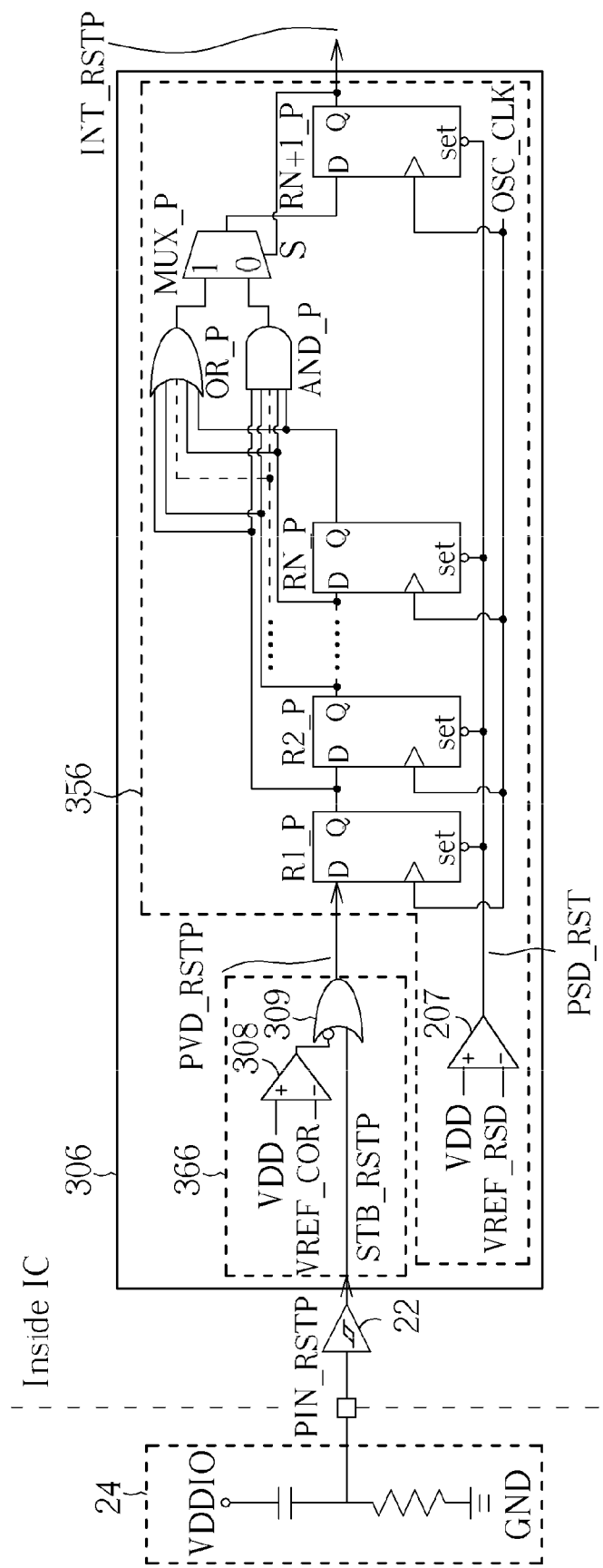
FIG. 14 is the circuit diagram of the second embodiment illustrating the high active reset signal filter.

Please refer to FIG. 13 and FIG. 14. FIG. 13 is a circuitry of the low active reset signal filter 301 in the second embodiment. FIG. 14 is a circuitry of the high active reset state signal filter 306 in the second embodiment. As shown in FIG. 13, the power voltage detector 361 of the low active reset signal filter 301 comprises a comparator 303 and an AND gate 304. The comparator 303 determines if the operation voltage VDD of the IC chip is smaller than the reference voltage VREF_COR. When the operation voltage VDD is greater than the reference voltage VREF_COR, the AND gate 304 outputs the power reset signal PVD_RSTN according to the output signal STB_RSTN of the Schmitt trigger buffer 22. The input port of the reset signal filter 351 receives the power reset signal PVD_RSTN. The function of the reset signal detector 351 of the low active reset signal filter 301 in the second embodiment is the same to the reset signal detector of the low active reset signal filter 201 in the first embodiment. As shown in FIG. 14. The power voltage detector 366 of the high active reset signal filter 306 comprises a comparator 308 and an OR gate 309. The comparator 308 determines if the operation voltage VDD of the IC chip is smaller than the reference voltage VREF_COR. When the operation voltage VDD is greater than the reference voltage VREF_COR, the output signal of the comparator 308 is inverted and input to an OR gate 309. Thus, the OR gate 309 outputs the power reset signal PVD_RSTP according to the output signal STB_RSTP of the Schmitt trigger buffer 22. The input port of the reset signal filter 356 receives the power reset signal PVD_RSTP. The function of the reset signal detector 356 of the high active reset signal filter 306 in the second embodiment is the same to the reset signal detector of the high active reset signal filter 206 in the first embodiment.

In conclusion, the reset signal filter comprises a power voltage detector and a reset signal detector or comprises only one reset signal detector. The power voltage detector comprises a comparators and a basic logic gates (e.g. AND gate, OR gate, inverter, etc). The reset signal detector comprises a comparator, N flip flops connected in series, an AND gate, an OR gate, a multiplexer and an output flip flop. The reset signal filter receives a first reset signal generated by a power voltage detector or a Schmitt trigger buffer and utilizes N flip flops to register the signal level of the first reset signal for N clock periods. Then the reset signal filter determines if the first rest signal is changed during N clock periods, and outputs a final reset signal.

Those skilled in the art will readily observe that numerous modifications and alterations of the device and method may be made while retaining the teachings of the invention.

What is claimed is:

1. A reset signal filter, comprising:
    a first comparator for comparing a power voltage and a first reference voltage so as to generate a first comparison signal;
    N flip-flops connected in series, a reset port of each flip-flop receiving the first comparison signal, an input port of each flip-flop being coupled to an output port of a preceding flip-flop, an input port of the first of the N flip-flops receiving a first reset signal, the N flip-flops connected in series registering levels of the first reset signal during N clock periods;
    a first logic gate, having N input ports coupled to output ports of the N flip-flops connected in series respectively, for determining if the levels of the first reset signal are identical during N clock periods and generating a logic signal; and
    an output flip-flop, being coupled to the first logic gate, for receiving the logic signal and outputting a second reset signal.

2. The rest signal filter of claim 1, wherein the first logic gate is an AND gate.

3. The rest signal filter of claim 1, wherein the first logic gate is an OR gate.

4. The rest signal filter of claim 1, further comprising:
    a second logic gate, having N input ports coupled to the output ports of the N flip-flops connected in series respectively; and
    a multiplexer having input ports coupled to the output ports of the first and second logic gate respectively, a control port coupled to the output port of the output flip-flop, and an output port coupled to the input port of the output flip-flop.

5. The rest signal filter of claim 4, wherein the first logic gate is an OR gate, and the second logic gate is an AND gate.

6. The rest signal filter of claim 1, further comprising a power voltage detector coupled to the input port of the first of the N flip-flops, wherein the power voltage detector comprises:
    a second comparator for comparing the power voltage and a second reference voltage so as to generate a second comparison signal; and
    a third logic gate, coupled to the second comparator, for receiving the second comparison signal and the first reset signal so as to output the first reset signal when the power voltage is stable.

7. The rest signal filter of claim 6, wherein the third logic gate is an AND gate.

8. The rest signal filter of claim 6, wherein the third logic gate is an OR gate and the second comparison signal is inputted to the OR gate through an inverter.

9. The rest signal filter of claim 1, wherein the first reset signal is generated by a Schmitt trigger buffer.

10. A reset signal filter, comprising:
    a reset signal detector for receiving a first reset signal to generate a second reset signal, the reset signal detector comprising:
        a comparator for comparing a power voltage and a reference voltage so as to generate a comparison signal;
        a non-reset state detection circuit coupled to receive the comparison signal for detecting the first reset signal if the first reset signal remains in a non-reset state over N clock periods; and
        a reset state detection circuit coupled to receive the comparison signal for detecting the first reset signal if the first reset signal remains in a reset state over N clock periods.

11. The reset signal filter of claim 10, wherein the first reset signal is generated by a Schmitt trigger buffer.

12. The reset signal filter of claim 10, further comprising a power voltage detector coupled to the reset signal detector, for receiving an output signal generated by a Schmitt trigger buffer and generating the first reset signal according to the stability of a power voltage.

13. A method of generating a stable reset signal, comprising:
    comparing a power voltage and a reference voltage so as to generate a comparison signal;
    receiving a first reset signal;

utilizing the comparison signal to determining when the first reset signal remains in a non-reset state; and generating a second reset signal when the first reset signal remains in a non-reset state over N clock periods.

14. The method of claim 13, further comprising:

generating the second reset signal when the first reset signal remains in reset state over N clock periods.

15. The method of claim 13, further comprising:

generating the first reset signal when a power voltage is stable.

16. The method of claim 13, wherein the first reset signal is generated by a Schmitt trigger buffer.

\* \* \* \* \*